(12) United States Patent
Byon

(10) Patent No.: US 8,664,932 B2
(45) Date of Patent: Mar. 4, 2014

(54) VOLTAGE GENERATING CIRCUIT, DEVICE INCLUDING THE SAME, AND METHOD OF GENERATING VOLTAGE

(75) Inventor: Sang-Woog Byon, Namyangju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 527 days.

(21) Appl. No.: 13/005,205

(22) Filed: Jan. 12, 2011

(65) Prior Publication Data

US 2011/0193535 A1    Aug. 11, 2011

(30) Foreign Application Priority Data

Feb. 11, 2010   (KR) ..................... 10-2010-0013014

(51) Int. Cl.
*G05F 3/16*    (2006.01)
*H03F 3/45*    (2006.01)

(52) U.S. Cl.
USPC .......................................... 323/313; 330/254

(58) Field of Classification Search
USPC ........... 323/312, 313; 341/126, 144; 330/127, 330/136, 254, 261
See application file for complete search history.

(56) References Cited

U.S. PATENT DOCUMENTS

| 4,631,518 | A | 12/1986 | Caspell |
| 5,051,707 | A * | 9/1991 | Fujita ............................ 330/279 |
| 5,914,637 | A * | 6/1999 | Kagawa ........................ 330/254 |
| 7,078,972 | B2 * | 7/2006 | Lin et al. ....................... 330/256 |
| 2006/0244647 | A1 | 11/2006 | Takano |

FOREIGN PATENT DOCUMENTS

| JP | 2006-311144 A | 11/2006 |
| JP | 2008-017383 A | 1/2008 |
| KR | 10 2005-0102005 A | 10/2005 |

\* cited by examiner

*Primary Examiner* — Matthew Nguyen
(74) *Attorney, Agent, or Firm* — Lee & Morse, P.C.

(57) ABSTRACT

A voltage generating circuit includes a range adjusting unit configured to output a code signal for adjusting the range of an output voltage and to determine a magnitude of the output voltage to set a control code while an output range adjusting operation is performed. The range adjusting unit is configured to output the code signal in response to a data code received from the outside after the output range adjusting operation is complete. The voltage generating circuit includes a digital analog converter configured to output a conversion voltage in response to the code signal, and an output unit configured to set an amplification gain thereof according to the control code and to amplify the conversion voltage according to the amplification gain to output the output voltage.

17 Claims, 9 Drawing Sheets

VOLTAGE GENERATING CIRCUIT, DEVICE INCLUDING THE SAME, AND METHOD OF GENERATING VOLTAGE

BACKGROUND

1. Field

Embodiments relate to a voltage generating circuit including a digital analog converter where an output range is automatically adjusted, a device including the same, and a method of generating a voltage.

2. Description of the Related Art

A voltage generating circuit including a digital analog converter (DAC) may convert a received digital code into a voltage corresponding to the digital code by using the DAC, and may amplify the converted voltage to generate an output voltage. A range of the output voltage in the voltage generating circuit may depend on an amplification gain.

SUMMARY

Embodiments provide a voltage generating circuit where the range of an output voltage is automatically adjusted according to a power supply voltage.

Embodiments may include a device having a voltage generating circuit where the range of an output voltage is automatically adjusted according to a power supply voltage.

Embodiments may include a method of generating a voltage whose range is automatically adjusted according to a power supply voltage.

In accordance with an aspect of the exemplary embodiments, a voltage generating circuit includes a range adjusting unit configured to output a code signal for adjusting the range of an output voltage and determine a magnitude of the output voltage to set a control code while an output range adjusting operation is performed and to output the code signal in response to a data code received from the outside after the output range adjusting operation is complete, a digital analog converter (DAC) configured to output a conversion voltage in response to the code signal, and an output unit configured to set an amplification gain thereof according to the control code and amplify the conversion voltage according to the amplification gain to output the output voltage.

The output unit may include a reference voltage generating unit configured to output a constant voltage irrelative to a power supply voltage as a reference voltage while the output range adjusting operation is performed, and to output a voltage generated in response to the power supply voltage as the reference voltage after the output range adjusting operation is complete, and an amplification unit configured to receive the conversion voltage and the reference voltage to output the output voltage according to the amplification gain.

The range adjusting unit may include a comparison signal generating unit configured to compare a first reference voltage generated in response to the power supply voltage with the output voltage to output a comparison signal, and a reading unit configured to output an initialization signal indicating whether or not the output range adjusting operation is performed, to receive the comparison signal to determine whether or not the output range adjusting operation is complete and set the control code in response to the comparison signal while the output range adjusting operation is performed, and to output the code signal in response to the data code after the output range adjusting operation is complete.

The reading unit may include a control unit configured to output the initialization signal, to determine whether or not the output range adjusting operation is complete according to whether a state of the comparison signal is changed or not and output an internal code signal set in response to the comparison signal while the output range adjusting operation is performed, and to output the code signal in response to the data code after the output range adjusting operation is complete, and a control code generating unit configured to output the control code in response to the internal code signal.

The control unit may be configured to vary the code signal in response to the comparison signal and output a varied code signal while the output range adjusting operation is performed, and to output the code signal at the time when the state of the comparison signal is changed as the internal code signal after the output range adjusting operation is complete, or configured to vary the internal code signal in response to the comparison signal and output the varied internal code signal while the output range adjusting operation is performed, and to store the internal code signal at the time when the state of the comparison signal is changed and output the stored internal code signal after the output range adjusting operation is complete.

The control code generating unit may be configured to output the remaining bits other than the most significant bit (MSB) of the internal code signal as a first control code or a second control code according to the MSB of the internal code signal.

The output unit may include a reference voltage generating unit configured to output a constant voltage irrelative to the power supply voltage as a reference voltage while the output range adjusting operation is performed, and output a voltage generated in response to the power supply voltage as the reference voltage after the output range adjusting operation is complete, in response to the initialization signal, a first variable resistor unit configured to connect between a terminal to which the output voltage is applied and a middle terminal and increase a resistance value thereof if the first control code is increased, a second variable resistor unit configured to connect between a terminal to which the reference voltage is applied and the middle terminal and increase a resistance value thereof if the second control code is decreased, and an operational amplifier configured to receive the conversion voltage and a voltage of the middle terminal to output the output voltage.

In accordance with another aspect of the exemplary embodiments, a device including a voltage generating circuit includes a main control unit configured to output a data code, and the voltage generating circuit which includes a range adjusting unit configured to output a code signal for adjusting the range of an output voltage and determine a magnitude of the output voltage to set a control code while an initialization operation is performed, and to output the code signal in response to the data code after the initialization operation is complete, a DAC configured to output a conversion voltage according to the code signal, and an output unit configured to set an amplification gain thereof according to the control code and amplify the conversion voltage according to the amplification gain to output the output voltage.

The device may further include a light source configured to radiate light in response to the output voltage.

The output unit may include a reference voltage generating unit configured to output a constant voltage irrelative to a power supply voltage as a reference voltage while the initialization operation is performed, and to output a voltage generated in response to the power supply voltage as the reference voltage after the initialization operation is complete, and amplification unit configured to receive the conversion voltage and the reference voltage to output the output voltage according to the amplification gain.

The range adjusting unit may include a comparison signal generating unit configured to compare a first reference voltage generated in response to the power supply voltage with the output voltage to output a comparison signal, and a reading unit configured to output an initialization signal indicating whether or not the initialization operation is performed, to receive the comparison signal to determine whether or not the initialization operation is complete and set the control code in response to the comparison signal while the initialization operation is performed, and to output the code signal in response to the data code after the initialization operation is complete.

The reading unit may include a control unit configured to output the initialization signal, to determine whether or not the initialization operation is complete according to whether a state of the comparison signal is changed or not and output an internal code signal set in response to the comparison signal while the initialization operation is performed, and to output the code signal in response to the data code after the initialization operation is complete, and a control code generating unit configured to output the control code in response to the internal code signal.

The control unit may be configured to vary the code signal in response to the comparison signal and output the varied code signal while the initialization operation is performed, and to output the code signal at the time when the state of the comparison signal is changed as the internal code signal after the initialization operation is complete, or configured to vary the internal code signal in response to the comparison signal and output the varied internal code signal while the initialization operation is performed, and to store the internal code signal at the time when the state of the comparison signal is changed and output the stored internal code signal after the initialization operation is complete.

The control code generating unit may be configured to output the remaining bits other than the MSB of the internal code signal as a first control code or a second control code according to the MSB of the internal code signal.

The output unit may include a reference voltage generating unit configured to output a constant voltage irrelative to the power supply voltage as a reference voltage while the initialization operation is performed, and output a voltage generated in response to the power supply voltage as the reference voltage after the initialization operation is complete in response to the initialization signal, a first variable resistor unit configured to connect between a terminal to which the output voltage is applied and a middle terminal and increase a resistance value thereof if the first control code is increased, a second variable resistor unit configured to connect between a terminal to which the reference voltage is applied and the middle terminal and increase a resistance value thereof if the second control code is decreased, and an operational amplifier configured to receive the conversion voltage and a voltage of the middle terminal to output the output voltage.

In accordance with still another aspect of the exemplary embodiments, a method of generating a voltage includes setting an initialization value of a code signal while an output range adjusting operation is performed, generating a conversion voltage in response to the code signal while the output range adjusting operation is performed, amplifying the conversion voltage to generate an output voltage while the output range adjusting operation is performed, determining a magnitude of the output voltage to set an amplification gain while the output range adjusting operation is performed, and outputting the output voltage in response to a set amplification gain after the output range adjusting operation is complete.

Setting the amplification gain may include comparing the output voltage and a voltage generated in response to a power supply voltage to generate a comparison signal, and determining whether or not a state of the comparison signal is changed, varying the code signal in response to the comparison signal if the state of the comparison signal is not changed, and setting the amplification gain according to the code signal at the time when the state of the comparison signal is changed if the state of the comparison signal is changed.

Alternatively, setting the amplification gain may include setting an initialization value of a control code according to the initialization value of the code signal, comparing the output voltage and a voltage generated in response to a power supply voltage to generate a comparison signal, and determining whether or not a state of the comparison signal is changed, varying the control code in response to the comparison signal if the state of the comparison signal is not changed, and setting the amplification gain according to the control code at the time when the state of the comparison signal is changed, wherein the generating of the output voltage while the output range adjusting operation is performed includes generating the output voltage according to the amplification gain varied in response to the control code.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
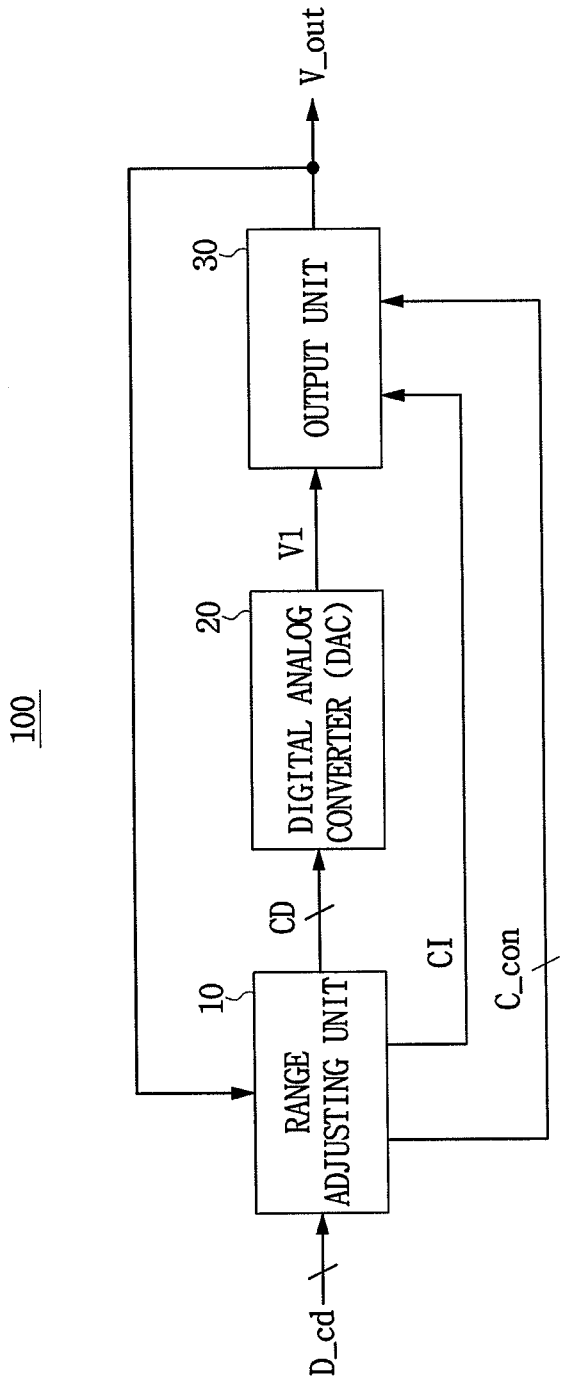
FIG. 1 illustrates a block diagram including a construction of a voltage generating circuit according to exemplary embodiments.

Korean Patent Application No. 10-2010-0013014, filed on Feb. 11, 2010, in the Korean Intellectual Property Office, and entitled: "Voltage Generating Circuit, Device Including the Same, and Method of Generating Voltage," is incorporated by reference herein in its entirety.

Various embodiments will now be described more fully with reference to the accompanying drawings in which some embodiments are shown. These exemplary embodiments may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a voltage generating circuit, a device including the voltage generating circuit and a voltage generating method according to exemplary embodiments will be described with reference to the accompanying drawings.

FIG. 1 is a block diagram illustrating a construction of a voltage generating circuit according to an exemplary embodiment. The voltage generating circuit 100 may include a range adjusting unit 10, a digital analog converter (DAC) 20, and an output unit 30. The functions of the blocks illustrated in FIG. 1 will be described as follows.

While an output range adjusting operation is performed, the range adjusting unit 10 outputs an initialization signal CI indicating whether or not the output range adjusting operation is performed and a code signal CD for adjusting the range of an output voltage V_out, and determines a magnitude of the output voltage V_out. According to the determined result, the range adjusting unit 10 determines whether or not the output range adjusting operation is terminated. After the output range adjusting operation is complete, the range adjusting unit 10 outputs the code signal CD in response to a data code D_cd received from the outside, and a control code C_con. While the output range adjusting operation is performed, the range adjusting unit 10 may compare the output voltage V_out with a voltage generated in response to a power supply voltage VDD to determine a magnitude of the power supply voltage VDD and whether or not the output range adjusting operation is complete, and set the control code C_con. The control code C_con may include a first control code and a second control code.

The DAC 20 outputs a conversion voltage V1 in response to the code signal CD. While the output range adjusting operation is performed, the DAC 20 may operate by receiving a constant voltage (or, a voltage generated by using the constant voltage) irrelative to the power supply voltage as a reference voltage. After the output range adjusting operation is complete, the DAC 20 may operate by receiving the power supply voltage VDD (or, a voltage generated by using the power supply voltage VDD) as a reference voltage. The constant voltage may be generated by using a bandgap reference circuit.

The output unit 30 may amplify the conversion voltage V1 in response to the initialization signal CI and the control code C_con to output the output voltage V_out. An amplification gain is decided by the control code C_con. For example, while the output range adjusting operation is performed, the output unit 30 may receive the constant voltage (or, the voltage generated by using the constant voltage) irrelative to the power supply voltage as the reference voltage, and receive the conversion voltage V1 to output the output voltage V_out. After the output range adjusting operation is complete, the output unit 30 may receive the power supply voltage (or the voltage generated by using the power supply voltage) as the reference voltage, and receive the conversion voltage V1 to output the output voltage V_out. The output unit 30 may input the initialization signal CI to determine whether or not the output range adjusting operation is performed.

A level of the constant voltage may be set when designed. In detail, the level of the constant voltage may be set according to the reference voltage used to adjust the amplification gain of the output unit 30 when designed.

That is, the voltage generating circuit 100 adjusts the amplification gain of the output unit 30 according to the applied power supply voltage while the output range adjusting operation is performed, thereby adjusting the output range of the output voltage V_out. The output range adjusting operation may be performed on performing an initialization operation (e.g. a power-up operation) of a device including the voltage generating circuit 100 according to an exemplary embodiment, be periodically performed, or be performed by detecting a change in the applied power supply voltage.

Figure 2:
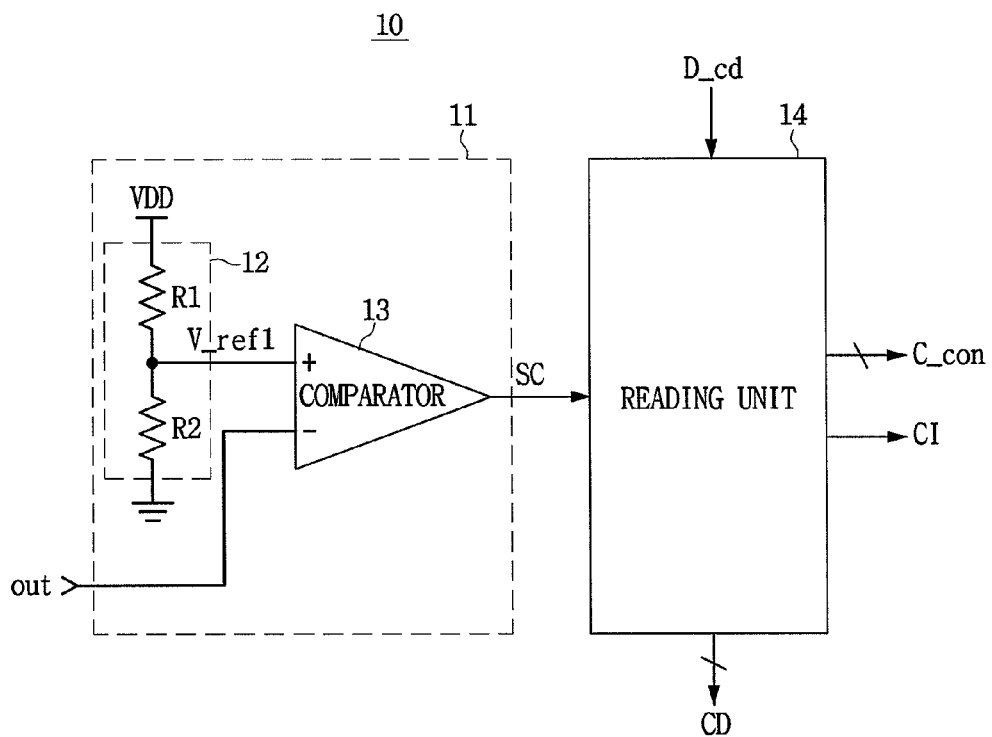
FIG. 2 illustrates a block diagram including a construction of a range adjusting unit of the voltage generating circuit of FIG. 1.

FIG. 2 is a block diagram illustrating a construction of the range adjusting unit 10 of the voltage generating circuit 100 of FIG. 1. The range adjusting unit 10 may include a comparison signal generating unit 11 and a reading unit 14. In addition, the comparison signal generating unit 11 may include a voltage divider 12 comprised of resistors R1 and R2, and a comparator 13. The functions of the blocks illustrated in FIG. 2 will be described as follows.

The comparison signal generating unit 11 outputs a comparison signal SC in response to the output voltage V_out. The voltage divider 12 outputs a first reference voltage V_ref1 in response to the power supply voltage VDD. The voltage divider 12 may include the resistors R1 and R2, and the resistors R1 and R2 may have the same resistance. That is, the voltage divider 12 may divide the power supply voltage VDD to output the first reference voltage V_ref1 which has a half level of the power supply voltage VDD. The comparator 13 compares the output voltage V_out and the first reference voltage V_ref1 to output the comparison signal SC. For example, if the output voltage V_out is higher than the first reference voltage V_ref1, the comparator 13 may output the comparison signal SC of a low level. If the output voltage V_out is lower than the first reference voltage V_ref1, the comparator 13 may output the comparison signal SC of a high level.

While the output range adjusting operation is performed, the reading unit 14 internally generates and outputs the code signal CD for an initialization operation in response to the comparison signal SC, and activates the initialization signal CI. In addition, the reading unit 14 receives the comparison signal SC to determine whether or not the output range adjusting operation is complete. After the output range adjusting operation is complete, the reading unit 14 outputs the control code C_con for setting the amplification gain of the output unit 30, outputs the code signal CD in response to the data code D_cd received from the outside, and inactivates the initialization signal CI.

While the output range adjusting operation is performed, the reading unit 14 may vary the code signal CD in response to the comparison signal SC. Further, after the output range adjusting operation is complete, the reading unit 14 may output the control code C_con in response to the code signal CD at that time of point. Alternatively, while the output range adjusting operation is performed, the reading unit 14 may vary the control code C_con in response to the comparison signal SC. Further, after the output range adjusting operation is complete, and the reading unit 14 may store the control code C_con at that time of point, and output the stored control code C_con to the output unit 30.

Figure 3:
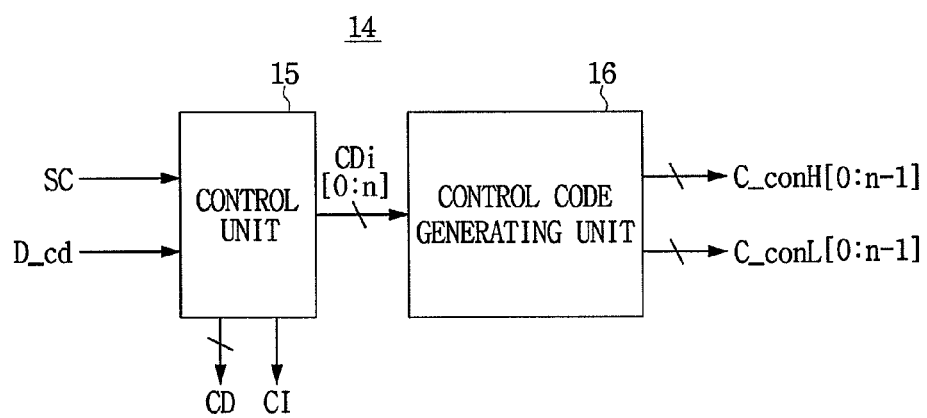
FIG. 3 illustrates a block diagram including a construction of a reading unit of the range adjusting unit in the voltage generating circuit of FIG. 2.

FIG. 3 is a block diagram illustrating a construction of the reading unit 14 of the range adjusting unit 10 of the voltage generating circuit 100 of FIG. 2. The reading unit 14 may include a control unit 15 and a control code generating unit 16. The functions of the blocks illustrated in FIG. 3 will be described as follows.

According to an exemplary embodiment, while the output range adjusting operation is performed, the control unit 15 may internally generate the code signal CD to adjust the range of the output voltage V_out, activate the initialization signal CI, and receive the comparison signal SC to determine whether or not the output range adjusting operation is complete. Alternatively, after the output range adjusting operation is complete, the control unit 15 may output an internal code signal CDi[0:n] and inactivate the initialization signal CI.

For example, while the output range adjusting operation is performed, the control unit 15 may vary the code signal CD in response to the comparison signal SC. That is, while the output range adjusting operation is performed, the control unit 15 first sets an initialization value of the code signal CD as an intermediate value of the code data D_cd (i.e., a value of the data code D_cd which causes the output of the DAC 20 to be an intermediate value of the maximum output of the DAC 20) and activates the initialization signal CI. Next, if the comparison signal SC indicates that the output voltage V_out is smaller than the first reference voltage Vref1, the control unit 15 increases the code signal CD. In contrast, if the comparison signal SC indicates that the output voltage V_out is larger than the first reference voltage Vref1, the control unit 15 decreases the code signal CD.

In addition, if a state of the comparison signal SC is changed, the control unit 15 may determine that the output range adjusting operation is complete. If it is detetmined that the output range adjusting operation is complete, the control unit 15 inactivates the initialization signal CI, and outputs the code signal CD at the time when the output range adjusting operation is complete as the internal code signal CDi[0:n].

According to another exemplary embodiment, while the output range adjusting operation is performed, the control unit 15 outputs the code signal CD for adjusting the range of the output voltage V_out, varies the internal code signal CDi[0:n] in response to the comparison signal SC, and receive the comparison signal SC to determine whether or not the output range adjusting operation is complete. When the output range adjusting operation is complete, the control unit 15 stores the internal code signal CDi[0:n] at that time of point. After the output range adjusting operation is complete, the control unit 15 outputs the code signal CD in response to the data code D_cd received from the outside and the stored internal code signal CDi[0:n]. The value of the code signal CD for adjusting the range of the output voltage V_out and the initialization value of the internal code signal CDi[0:n] may be set as the intermediate value of the data code D_cd.

For example, while the output range adjusting operation is performed, the control unit 15 outputs the code signal CD which has the intermediate value of the data code D-cd. In addition, the output unit 15 sets the initialization value of the internal code signal CDi[0:n] as the intermediate value of the data code D_cd. Next, if the comparison signal SC indicates that the output voltage V_out is smaller than the first reference voltage V_ref1, the control unit 15 increases the internal code signal CDi[0:n]. In contrast, if the comparison signal SC indicates that the output voltage V_out is larger than the first reference voltage V_ref1, the control unit 15 decreases the internal code signal CDi[0:n]. If the state of the comparison signal SC is changed, the control unit 15 determines that the output range adjusting operation is complete, stores the internal code signal CDi[0:n] at the time when the output range adjusting operation is complete, and then outputs the stored internal code signal CDi[0:n]. In addition, after the output range adjusting operation is complete, the output unit 15 outputs the code signal CD in response to the data code D_cd received from the outside.

The control unit 15 may include a digital front end (DFE).

The control code generation unit 16 receives the internal code signal CDi[0:n] to generate the control code C_con. The control code C_con may include a first control code C_conH[0:n−1] and a second control code C_conL[0:n−1]. The first control code C_conH[0:n−1] may be used to increase the amplification gain of the output unit 30 and the second control code C_conL[0:n−1] may be used to decrease the amplification gain of the output unit 30. Although not illustrated, the control code generating unit 16 may be configured to operate in response to the initialization signal CI.

Figure 4:
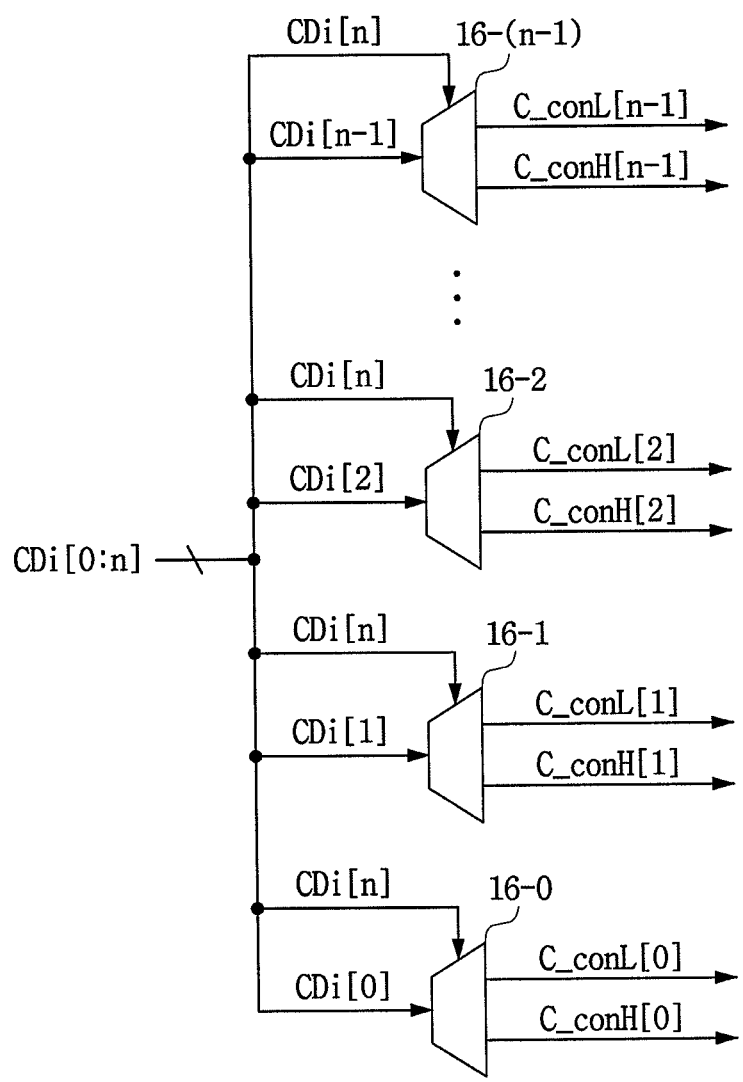
FIG. 4 illustrates a construction of a control code generating unit of the reading unit illustrated in FIG. 3.

FIG. 4 illustrates a construction of the control code generating unit 16 of the reading unit 14 illustrated in FIG. 3. The control code generating unit 16 may include a plurality of demultiplexers 16-0 to 16-(n−1).

Each of the plurality of demultiplexers 16-0 to 16-(n−1) receives the most significant bit (MSB) CDi[n] of the internal code signals CDi[0:n] as a select signal, and a corresponding bit of the remaining bits CDi[0:n−1] of the internal control code signals CDi[0:n] other than the MSB as an input signal.

That is, the control code generating unit 16 including the plurality of demultiplexers 16-0 to 16-(n−1) may output the remaining bits CDi[0:n−1] other than the MSB CDi[n] of the internal code signal CDi[0:n] as the first control code C_conH[0:n−1] or the second control code C_conL[0:n−1] in response to the MSB CDi[n] out of the internal code signal CDi[0:n]. For example, if the MSB CDi[n] of the internal code signal CDi[0:n] is a high level, the control code generating unit 16 outputs the internal code signal CDi[0:n−1] as the first control code C_conH[0:n−1], and outputs the second control code C_conL[0:n−1] to a high level. In contrast, if the MSB CDi[n] of the internal code signal CDi[0:n] is a low level, the control code generating unit 16 outputs the internal control code signal CDi[0:n−1] as the second control code C_conL[0:n−1], and outputs the first control code C_conH[0:n−1] to a low level.

As described above, if the comparison signal SC indicates that the output voltage V_out is smaller than the first reference voltage V_ref1, the control unit 15 increases the code signal CD or the internal code signal CDi[0:n]. If the output voltage V_out is smaller than the first reference voltage V_ref1, it means that the applied power supply VDD is higher than a voltage considered when the amplification gain of the output unit 30 is designed. Accordingly, to increase the amplification gain, the control unit 15 increases the code signal CD or the internal code signal CDi[0:n]. Therefore, in the case where the initialization value of the code signal CD or the internal code signal CDi[0:n] is set as the intermediate value (e.g. 1000 in the case of 4 bits), if the value of the MSB CDi[n] at the time when the state of the comparison signal SC is changed is "1", it means the case where the amplification gain must be increased. Accordingly, to increase the amplification gain, the control code generating unit 16 outputs the internal control code signal CDi[0:n−1] as the first control code C_conH[0:n−1] and the second control code C_conL[0:n−1] to a high level. In contrast, if the output voltage V_out is larger than the first reference voltage V_ref1, the value of MSB CDi[n] at the time when the state of the comparison signal SC is changed becomes "0", which means the case where the amplification gain must be decreased. Accordingly, in order to decrease the amplification gain, the control code generating unit 16 outputs the internal control code signals CDi[0:n−1] as the second control code C_conL[0:n−1] and the first control code C-conH[0:n−1] to a low level.

According to an exemplary embodiment, the plurality of demultilexers 16-0 to 16-(n−1) may each receive the initialization signal CI as an enable signal. In this case, if the initialization signal CI is in an activation state, the plurality of demultipexers 16-0 to 16-(n−1) are each inactivated to output the corresponding first control code C_conH[0:n−1] to a low level and the corresponding second control code C_conL[0:n−1] to a high level.

That is, while the output range adjusting operation is performed, the control code generating unit 16 including the plurality of demultiplexers 16-0 to 16-(n−1) may be inactivated to output the first control code C_conH[0:n−1] of a low level and the second control code C_conL[0:n−1] of a high level. After the output range adjusting operation is complete, the control code generating unit 16 may be enabled in response to the inactivated initialization signal CI and output the first control code C_conH[0:n−1] and the second control code C_conL[0:n−1] in response to the internal code signal CDi[0:n].

In other words, the control code generating unit 16 according to an exemplary embodiment outputs the first control code C_conH[0:n−1] and the second control code C_conL[0:n−1] which are constant while the output range adjusting operation is performed, and outputs the first control code C_conH[0:n−1] and the second control code C_conL[0:n−1] in response to the internal code signal CDi[0:n] output from the control unit 15 after the output range adjusting operation is complete.

According to another exemplary embodiment, the control code generating unit 16 varies and outputs the first control code C_conH[0:n−1] and the second control code C_conL[0:n−1] in response to the internal code signal CDi[0:n] which is varied while the output range adjusting operation is performed, and outputs the first control code C_conH[0:n−1] and the second control code C_conL[0:n−1] which are fixed in response to the fixed internal code signals CDi[0:n] output from the control unit 15 after the output range adjusting operation is complete.

Figure 5:
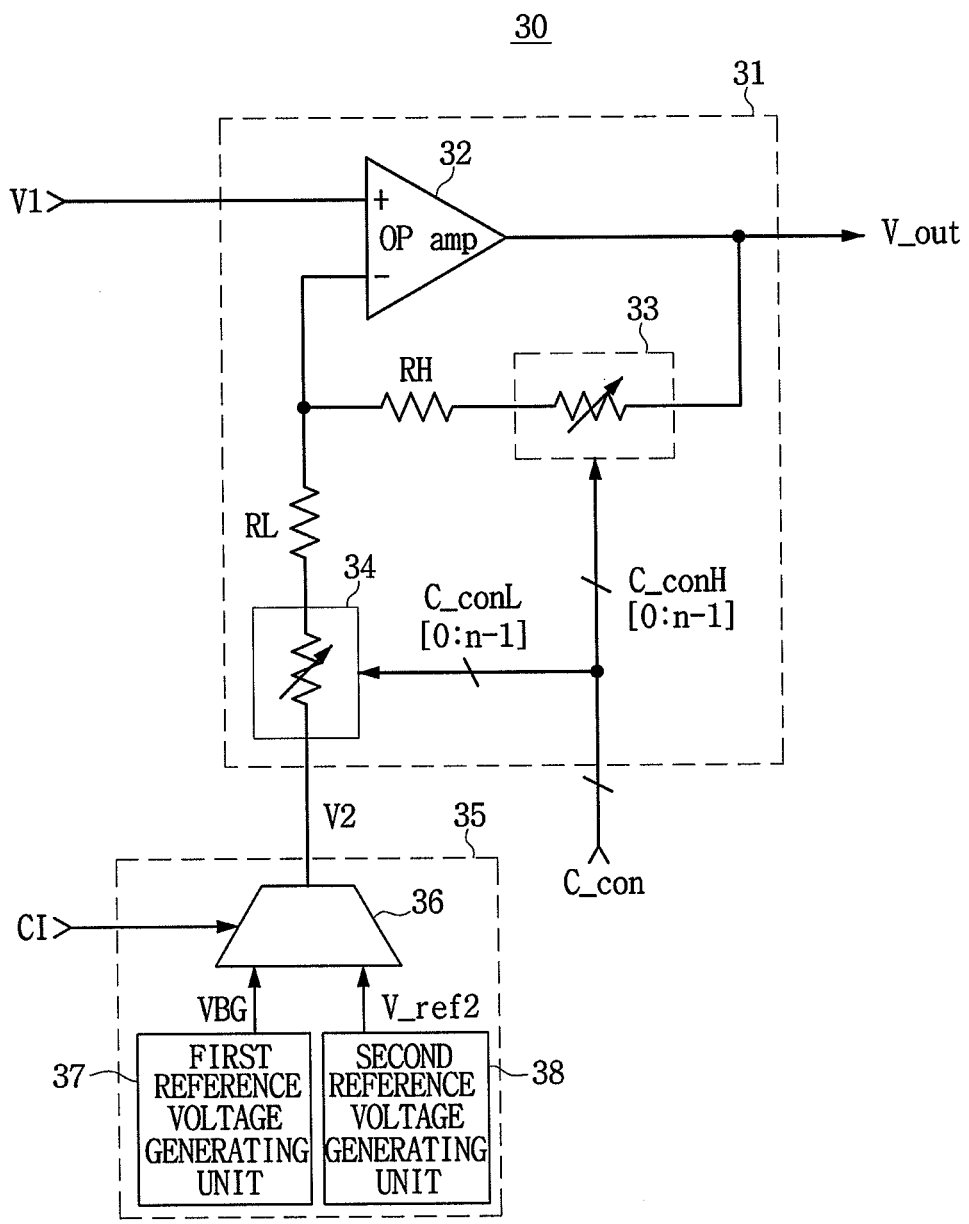
FIG. 5 illustrates a block diagram of a construction of an output unit of the voltage generating circuit of FIG. 1.

FIG. 5 is a block diagram illustrating a construction of the output unit 30 illustrated in FIG. 1. The output unit 30 may include an amplification unit 31 and a reference voltage generating unit 35. The amplification unit 31 may include an amplifier 32, resistors RH and RL, a first variable resister unit 33, and a second variable resistor unit 34. The reference voltage generating unit 35 may include a multiplexer 36, a first reference voltage generating unit 37, and a second reference voltage generating unit 38. The functions of the blocks illustrated in FIG. 5 will be described as follows.

The amplification 31 receives a conversion voltage V1 and a reference voltage V2 to amplify a difference between the conversion voltage V1 and the reference voltage V2, thereby outputting an output voltage V_out. An amplification gain of the amplification unit 31 is adjusted according to the control code C_con. In the amplification unit 31 according to an exemplary embodiment, while the output range adjusting operation is performed, the amplification gain is fixed. Afterwards, when the output range adjusting operation is complete, the amplification gain is decided according to the code signal CD at that time of point. In the amplification unit 31 according to another exemplary embodiment, while the output range adjusting operation is performed, the amplification gain is varied. When the output range adjusting operation is complete, the amplification gain at that time of point is fixed as the amplification gain in the following operation.

A value of the resistance of the first variable resistor unit 33 is varied according to the first control code C_conH[0:n−1]. The resistance of the first variable resistor unit 33 may be increased in proportion to the first control code C_conH[0:n−1]. For example, if the first control code C_conH[0] is "1," the resistance of the first variable resistor unit 33 may be increased by R. If the first control code C_conH[1] is "1," the resistance of the first variable resistor unit 33 may be increased by 2R. If the first control code C_conH[2] is "1," the resistance of the first variable resistor unit 33 may be increased by 4R. That is, if the first control code C_conH[k] is "1," the resistance of the first variable resistor unit 33 may be increased by $2^k *R$.

A value of the resistance of the second variable resistor unit 34 is varied according to the second control code C_conL[0:n−1]. The resistance of the second variable resistor unit 34 may be increased in inverse proportion to the second control code C_conL. For example, if the second control code C_conL[0] is "0," the resistance of the second variable resistor unit 34 may be increased by R. If the second control code C_conL[1] is "0," the resistance of the second variable resistor unit 34 may be increased by 2R. If the second control code C_conL[2] is "0," the resistance of the second variable resistor unit 34 may be increased by 4R. That is, if the second control code C_conL[k] is "0," the resistance of the second variable resistor unit 34 may be increased by $2^k *R$.

The reference voltage generating unit 35 outputs the reference voltage V2 in response to the initialization signal CI.

The first reference voltage generating unit 37 generates a constant voltage VBG that is not influenced by a power supply voltage and a temperature. The first reference voltage generating unit 37 may include a constant voltage generating circuit using a bandgap reference circuit.

The second voltage generating unit 38 outputs a second reference voltage V_ref2 in response to the power supply voltage. The second voltage generating unit 38 may include a voltage divider which divides the power supply voltage to output the second reference voltage V_ref2. The second reference voltage V_ref2 may have a half level of the power supply voltage VDD.

While the output range adjusting operation is performed, the multiplexer 36 may output the constant voltage VBG as the reference voltage in response to the initialization signal CI. After the output range adjusting operation is complete, the multiplexer 36 may output the second reference voltage V_ref2 as the reference voltage V2 in response to the initialization signal CI.

Figure 6A:
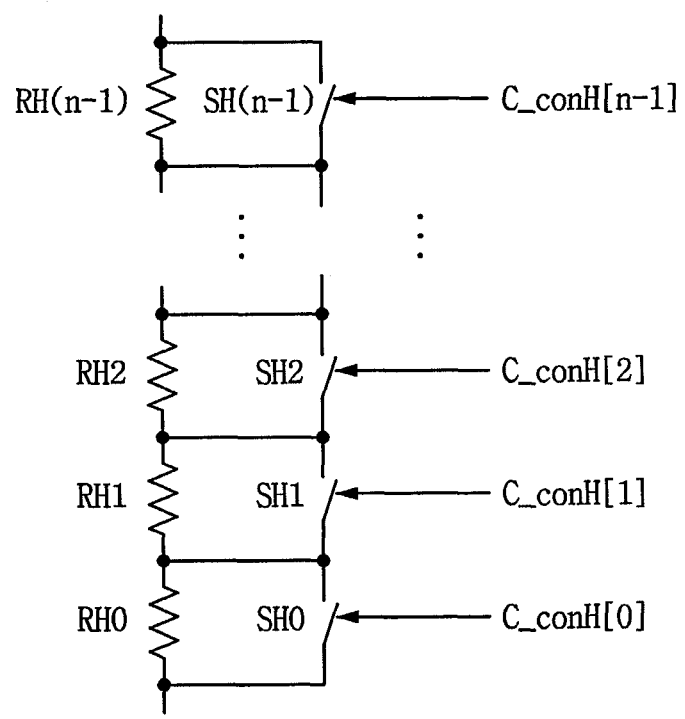
FIGS. 6A and 6B illustrate constructions of a first variable resistor unit and a second variable resistor unit, respectively, of the output unit in the voltage generating circuit of FIG. 5.
Figure 6B:
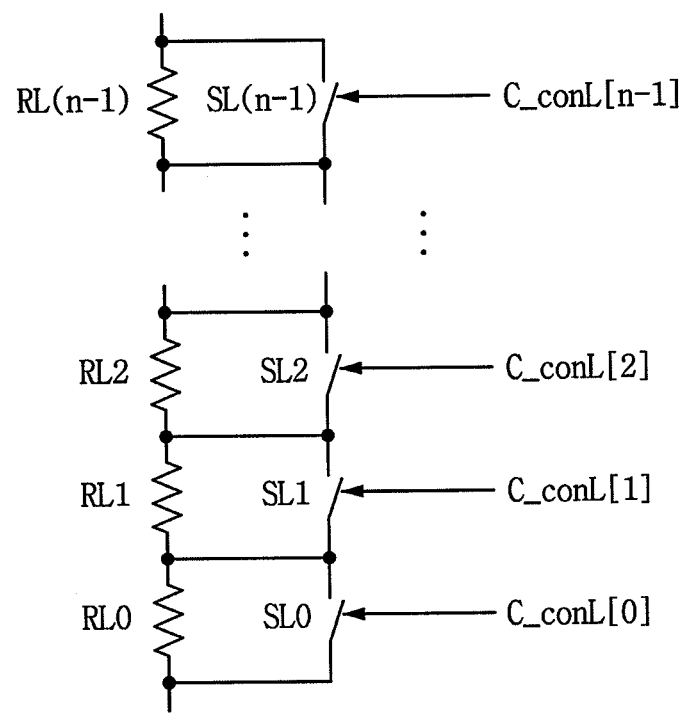

FIGS. 6A and 6B illustrate constructions of the first and second variable resistor units 33 and 34 illustrated in FIG. 5, respectively. The first variable resistor 33 may include a plurality of first resistors RH0 to RH(n−1) connected in series and a plurality of switches SH0 to SH(n−1), which are connected parallel to the respective first resistors RH0 to RH(n−1). The second variable resistor 34 may include a plurality of second resistors RL0 to RL(n−1) connected in series and a plurality of switches SL0 to SL(n−1), which are connected parallel to the respective second resistors RL0 to RL(n−1).

If the first resistor RH0 has a value of R, each of the first resistors RH(k) (herein, k is an integral between 1 and n−1) may have a value of $2^k *R$. If the second resistor RL0 has a value of R, each of the second resistors RL(k) (herein, k is an integral between 1 and n−1) may have a value of $2^k *R$. Further, each of the first switches SH0 to SH(n−1) may be turned on when the corresponding bit of the first control code C_conH[0:n−1] is "0" and turned off when the corresponding bit of first control code C_conH[0: n−1] is "1". Each of the second switches SL0 to SL(n−1) may be turned on when the corresponding bit of the second control code C_conL[0:n−1] is "1", and turned off when the corresponding bit of the second control code C_conL[0:n−1] is "0".

Figure 7:
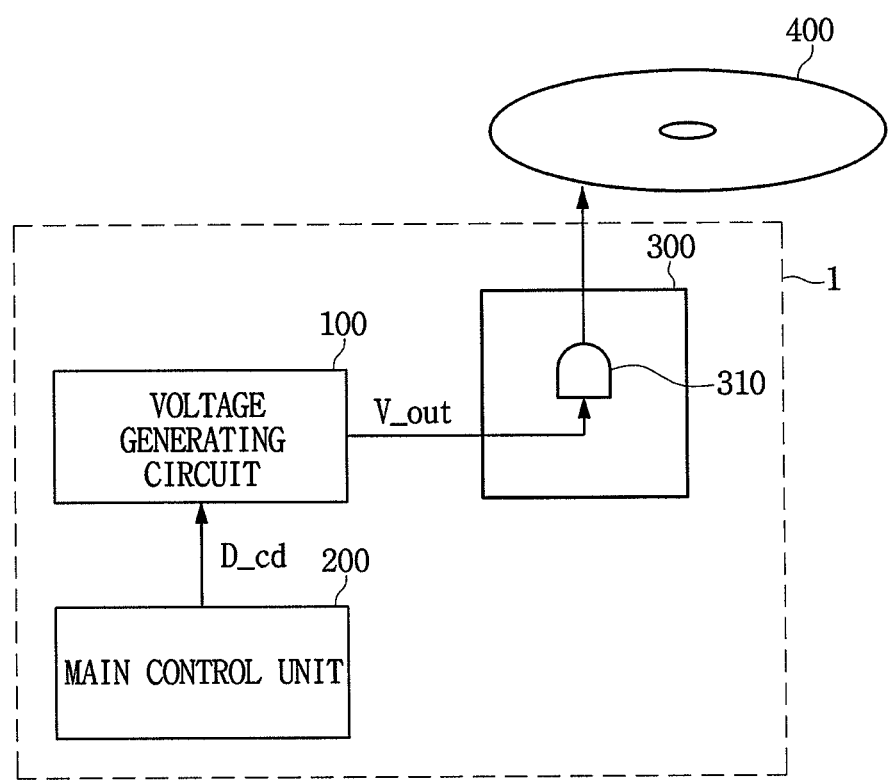
FIG. 7 illustrates a construction of an optical disk driver including a voltage generating circuit according to exemplary embodiments.

FIG. 7 illustrates the construction of a device including a voltage generating circuit according to exemplary embodiments. In FIG. 7, an example of the device is an optical disc apparatus 1. The optical disc apparatus 1 may include a voltage generating circuit 100, a main control unit 200 and a pick-up unit 300 including a light source 310. In FIG. 7, the reference numeral 400 denotes an optical disc.

The functions of the blocks illustrated in FIG. 7 will be described as follows.

The voltage generating circuit 100 may have the same construction as that illustrated in FIGS. 1 to 6B. The voltage generating unit adjusts the range of an output voltage V_out when an initialization operation is performed, and outputs the output voltage V_out in response to a data code D_cd received from the control unit 200 when the initialization operation is complete. That is, the output range adjusting operation described above is performed while the initialization operation of the device including a voltage generating circuit is performed.

The main control unit 200 outputs the data code D_cd. For example, the main control unit 200 may output the data code D_cd when manipulated by a user.

The pick-up unit 300 includes the light source 310 for radiating light in response to the output voltage V_out, and radiates the light to the optical disc 400 according to the output voltage V_out.

Although it is illustrated in FIG. 7 that the voltage generating circuit according to exemplary embodiments is applied to the optical disc apparatus, the voltage generating circuit may be applied to various apparatuses.

Figure 8:
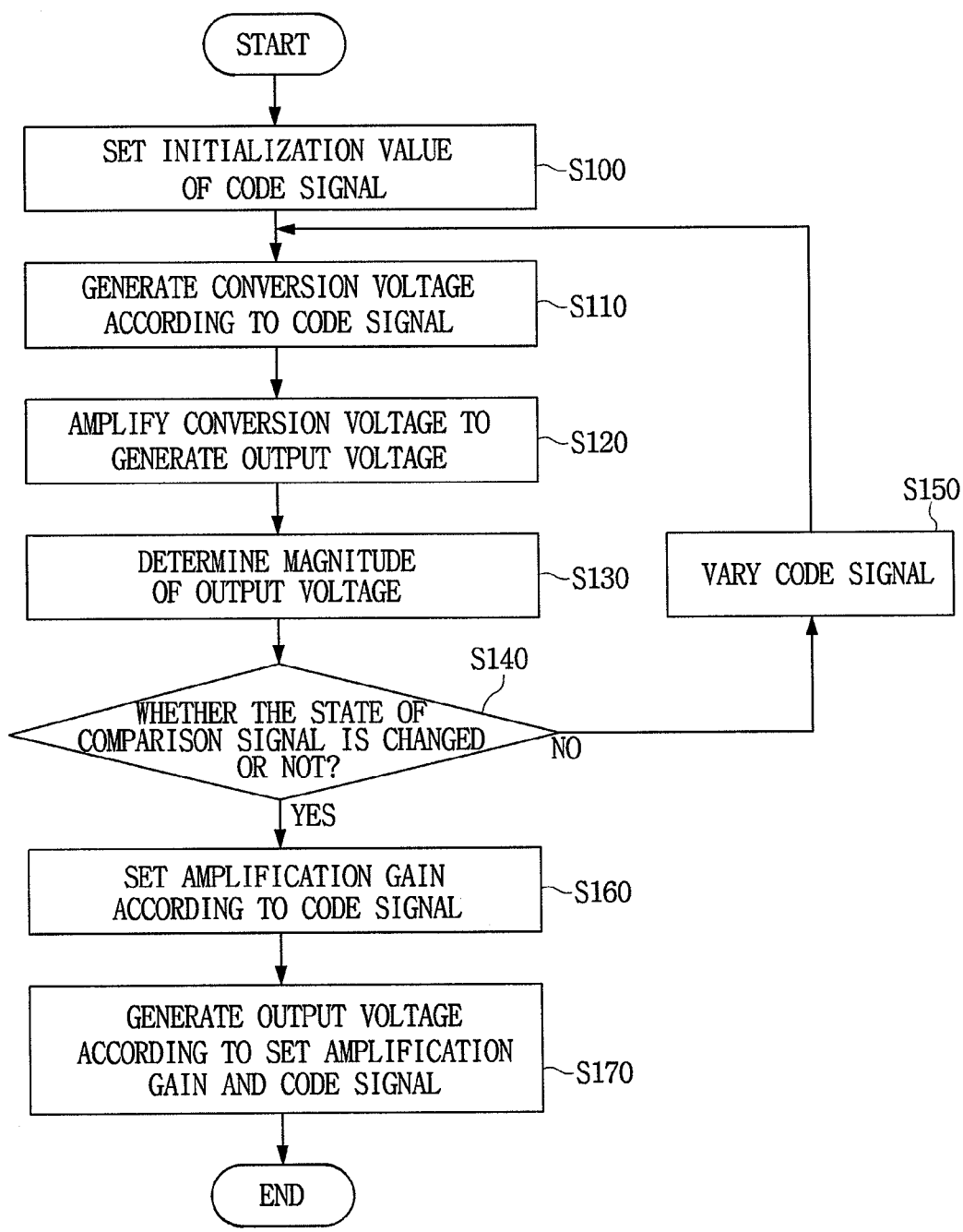
FIG. 8 illustrates a flowchart including an operation of a voltage generating method according to an exemplary embodiment.

FIG. 8 is a flowchart for explaining a voltage generating method according to an exemplary embodiment. The voltage generating method according to an exemplary embodiment will be described below with reference to FIG. 8.

First, the initialization value of a code signal CD is set (S100). The initialization value of the code signal CD may be an intermediate value of the data code C_cd.

Next, a conversion voltage V1 is generated according to the code signal CD (S110). The conversion voltage V1 may be generated through the DAC 20. At this time, a constant voltage generated by using a bandgap reference circuit may be applied to the DAC 20.

Next, the conversion voltage V1 is amplified to output an output voltage V_out (S120).

Next, a magnitude of the output voltage V_out is determined to output a comparison signal SC (S130). For example, by comparing the output voltage V_out with the half of a power supply voltage VDD, it is determined whether the output voltage V_out is larger than or smaller than the half of the power supply voltage VDD.

Next, it is determined whether or not the state of the comparison signal SC is changed (S140).

As a result of the determination in the step S140, if the state of the comparison signal SC is not changed, the code signal CD is varied in response to the comparison signal SC (S150), and then the steps S110 to S140 are repeated.

As a result of the determination in the step S140, if the state of the comparison SC is changed, an amplification gain is set according to the code signal CD at that time of point (S160). For example, the code signal CD at the time when the state of the comparison signal SC is changed may be output as an internal code signal CDi, and a first control code C_conH and a second control code C_conL may be generated in response to the internal code signal CDi, so that the amplification gain can be set. By performing the steps S100 to S160, an output range adjusting operation is performed.

Next, the output voltage V_out is generated according to the set amplification gain and the code signal CD (S170). At this time, the power supply voltage may be applied to the DAC 20.

Figure 9:
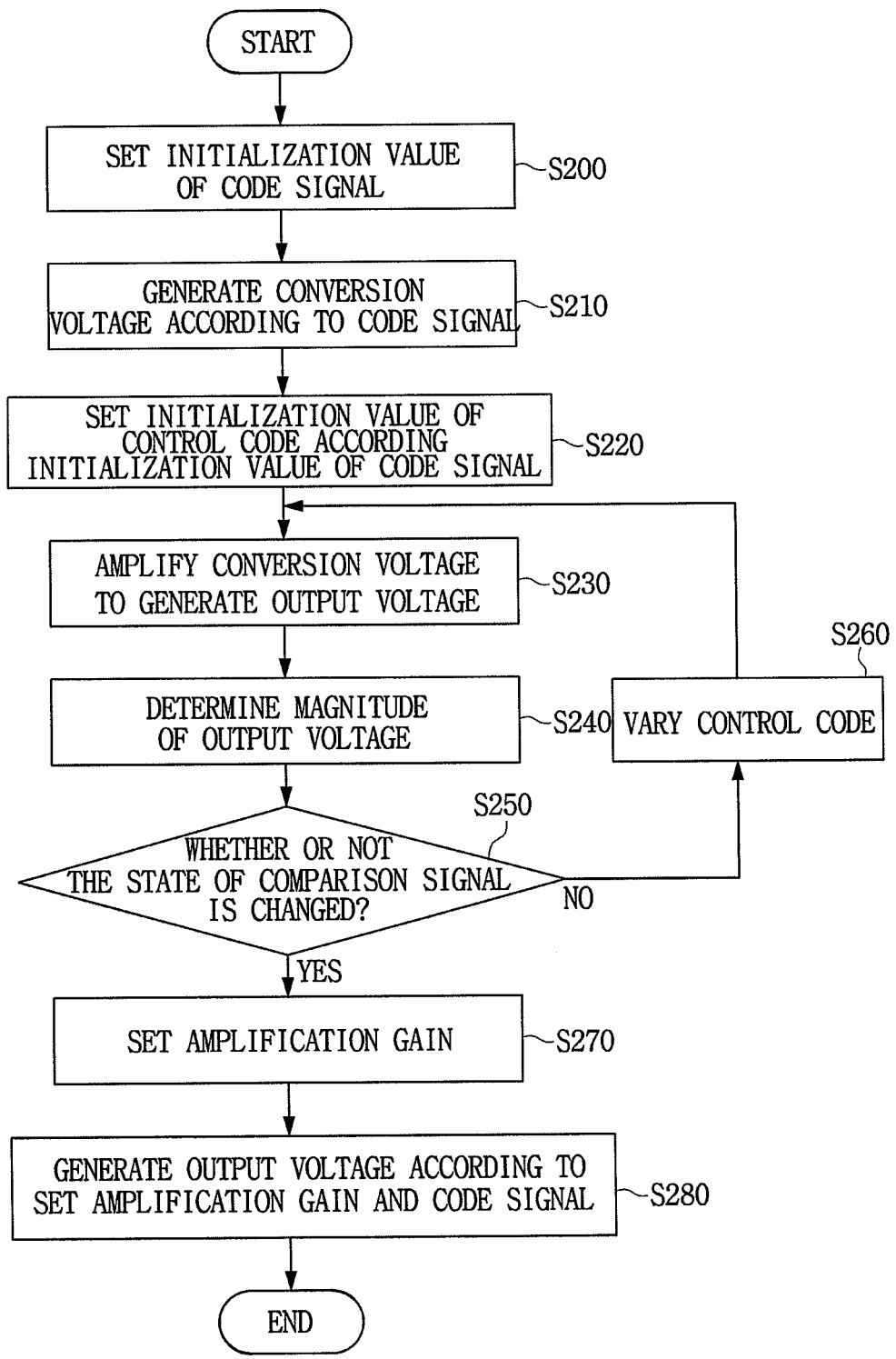
FIG. 9 illustrates a flowchart including an operation of a voltage generating method according to an exemplary embodiment.

FIG. 9 is a flowchart for explaining a voltage generating method according to another exemplary embodiment. The voltage generating method according to an exemplary embodiment will be described below with reference to FIG. 9.

First, the initialization value of a code signal CD is set (S200). The initialization value of the code signal CD may be an intermediate value of a data code C_cd.

Next, a conversion voltage V1 is generated according to the code signal CD (S210). The conversion voltage V1 may be generated through the DAC 20. At this time, a constant voltage generated by using a bandgap reference circuit may be applied to the DAC 20.

Next, the initialization value of a control code C_con is set according to the initialization value of the code signal CD (S220). For example, the initialization value of the code signal CD is output as an internal code signal CDi, and the control code C_con is output in response to the internal code signal CDi, so that the initialization value of the control code C_con can be set.

Next, the conversion voltage V1 is amplified to output an output voltage V_out (S230). At this time, an amplification gain is decided by the control code C_con.

Next, a magnitude of the output voltage V_out is determined to output a comparison signal SC (S240). For example, by comparing the output voltage V_out with the half of a power supply voltage VDD, it is determined whether the sub-output voltage V_out is larger than or smaller than the half of the power supply voltage VDD.

Next, it is determined whether or not the state of the comparison signal SC is changed (S250).

As a result of the determination in the step S250, if the state of the comparison signal SC is not changed, the control code C_con is varied in response to the comparison signal SC (S260), and the steps S230 to S250 are repeated. For example, the internal code signal CDi may be varied in response to the comparison signal SC, and the control code C_con may be generated in response to the varied internal code signal CDi, so that the control code C_con can be varied. Accordingly, the amplification gain is changed according to the varied control code C_con.

As a result of the determination in the step S250, if the state of the comparison SC is changed, the amplification gain is set according to the control code (S270). For example, the internal code signal CDi at the time when the state of the comparison signal SC is changed may be stored, and the control code C_con (i.e., a first control code C_conH and a second control code C_conL) may be generated in response to the stored internal code signal CDi, so that the amplification gain can be set. By performing the steps S200 to S270, an output range adjusting operation may be performed.

Next, the output voltage V_out is generated according to the set amplification gain and the code signal CD (S280). At this time, the power supply voltage may be applied to the DAC 20.

Accordingly, a voltage generating circuit, a device including the voltage generating circuit, and a voltage generation method can automatically adjust the range of an output voltage according to a power supply voltage.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A voltage generating circuit, comprising:
a range adjusting unit configured to output a code signal to adjust a range of an output voltage and to determine a magnitude of the output voltage to set a control code while an output range adjusting operation is performed, the range adjusting unit being configured to output the code signal in response to a data code received from the outside after the output range adjusting operation is complete;
a digital analog converter configured to output a conversion voltage in response to the code signal; and
an output unit configured to set an amplification gain thereof according to the control code and to amplify the conversion voltage according to the amplification gain to output the output voltage, wherein the output unit includes:
a reference voltage generator configured to output a substantially constant voltage irrelative to a power supply as a reference voltage while the output range adjusting operation is performed, and configured to output a voltage generated in response to the power supply as the reference voltage after the output range adjusting operation is complete; and
an amplifier configured to receive the conversion voltage and the reference voltage to output the output voltage according to the amplification gain.

2. A voltage generating circuit comprising:
a range adjusting unit configured to output a code signal to adjust a range of an output voltage and to determine a magnitude of the output voltage to set a control code while an output range adjusting operation is performed, the range adjusting unit being configured to output the code signal in response to a data code received from the outside after the output range adjusting operation is complete;
a digital analog converter configured to output a conversion voltage in response to the code signal; and
an output unit configured to set an amplification gain thereof according to the control code and to amplify the conversion voltage according to the amplification gain to output the output voltage, wherein the range adjusting unit includes:
a comparison signal generating unit configured to compare a first reference voltage generated in response to a power supply with the output voltage to output a comparison signal; and
a reading unit configured to output an initialization signal indicating whether the output range adjusting operation is performed, to receive the comparison signal to determine whether the output range adjusting operation is complete and to set the control code in response to the comparison signal while the output range adjusting operation is performed, and to output the code signal in response to the data code after the output range adjusting operation is complete.

3. The voltage generating circuit as claimed in claim 2, wherein the reading unit includes:
a control unit configured to output the initialization signal, to determine whether the output range adjusting operation is complete according to whether a state of the comparison signal is changed and to output an internal code signal set in response to the comparison signal while the output range adjusting operation is performed, and to output the code signal in response to the data code after the output range adjusting operation is complete; and
a control code generating unit configured to output the control code in response to the internal code signal.

4. The voltage generating circuit as claimed in claim 3, wherein the control unit is configured to vary the code signal in response to the comparison signal and to output the varied code signal while the output range adjusting operation is performed, and is configured to output the code signal at the time when the state of the comparison signal is changed as the internal code signal after the output range adjusting operation is complete.

5. The voltage generating circuit as claimed in claim 3, wherein the control unit is configured to vary the internal code signal in response to the comparison signal and to output the varied internal code signal while the output range adjusting operation is performed, and is configured to store the internal code signal at the time when the state of the comparison signal is changed and to output the stored internal code signal after the output range adjusting operation is complete.

6. The voltage generating circuit as claimed in claim 3, wherein the control code generating unit is configured to output remaining bits other than a most significant bit (MSB) of the internal code signal as a first control code or a second control code according to the MSB of the internal control code signal.

7. The voltage generating circuit as claimed in claim 6, wherein the output unit includes:
a reference voltage generating unit configured to output a constant voltage irrelative to the power supply as a reference voltage while the output range adjusting operation is performed, and configured to output a voltage generated in response to the power supply as the reference voltage after the output range adjusting operation is complete, in response to the initialization signal;
a first variable resistor unit configured to connect between a terminal to which the output voltage is applied and a middle terminal and to increase a resistance value thereof if the first control code is increased;
a second variable resistor unit configured to connect between a terminal to which the reference voltage is applied and the middle terminal and to increase a resistance value thereof if the second control code is decreased; and
an operational amplifier configured to receive the conversion voltage and a voltage of the middle terminal to output the output voltage.

8. A device, comprising:
a main control unit configured to output a data code; and
a voltage generating circuit, the voltage generating circuit including:
a range adjusting unit configured to output a code signal for adjusting a range of an output voltage and to determine a magnitude of the output voltage to set a control code while an initialization operation is performed, the range adjusting unit being configured to output the code signal in response to the data code after the initialization operation is complete,
a digital analog converter configured to output a conversion voltage in response to the code signal, and
an output unit configured to set an amplification gain thereof according to the control code and to amplify the conversion voltage according to the amplification gain to output the output voltage, wherein the output unit includes:
a reference voltage generating unit configured to output a constant voltage irrelative to a power supply as a reference voltage while the initialization operation is performed, and configured to output a voltage generated in response to the power supply voltage as the reference voltage after the initialization operation is complete; and
an amplification unit configured to receive the conversion voltage and the reference voltage to output the output voltage according to the amplification gain.

9. The device as claimed in claim 8, further comprising a light source configured to radiate light in response to the output voltage.

10. A device, comprising:
a main control unit configured to output a data code; and
a voltage generating circuit, the voltage generating circuit including:
a range adjusting unit configured to output a code signal for adjusting a range of an output voltage and to determine a magnitude of the output voltage to set a control code while an initialization operation is performed, the range adjusting unit being configured to output the code signal in response to the data code after the initialization operation is complete,
a digital analog converter configured to output a conversion voltage in response to the code signal, and
an output unit configured to set an amplification gain thereof according to the control code and to amplify the conversion voltage according to the amplification gain to output the output voltage, wherein the range adjusting unit includes:
a comparison signal generating unit configured to compare a first reference voltage generated in response to the power supply with the output voltage to output a comparison signal; and
a reading unit configured to output an initialization signal indicating whether the initialization operation is performed, to receive the comparison signal to determine whether the initialization operation is complete and to set the control code in response to the comparison signal while the initialization operation is performed, and to output the code signal in response to the data code after the initialization operation is complete.

11. The device as claimed in claim 10, wherein the reading unit includes:
a control unit configured to output the initialization signal, to determine whether the initialization operation is complete according to whether a state of the comparison signal is changed and to output an internal code signal set in response to the comparison signal while the initialization operation is performed, and to output the code signal in response to the data code after the initialization operation is complete; and a control code generating unit configured to output the control code in response to the internal code signal.

12. The device as claimed in claim 11, wherein the control unit is configured to vary the code signal in response to the comparison signal and to output the varied code signal while the initialization operation is performed, and is configured to output the code signal at the time when the state of the comparison signal is changed as the internal code signal after the initialization operation is complete.

13. The device as claimed in claim 11, wherein the control unit is configured to vary the internal code signal in response to the comparison signal and to output the varied internal code signal while the initialization operation is performed, and is configured to store the internal code signal at the time when the state of the comparison signal is changed and output the stored internal code signal after the initialization operation is complete.

14. The device as claimed in claim 11, wherein the control code generating unit is configured to output remaining bits other than a most significant bit (MSB) of the internal code signal as a first control code or a second control code according to the MSB of the internal code signal.

15. The device as claimed in claim 14, wherein the output unit includes:
a reference voltage generating unit configured to output a constant voltage irrelative to the power supply as a reference voltage while the initialization operation is performed, and configured to output a voltage generated in response to the power supply voltage as the reference voltage after the initialization operation is complete, in response to the initialization signal;
a first variable resistor unit configured to connect between a terminal to which the output voltage is applied and a middle terminal and to increase a resistance value thereof if the first control code is increased;
a second variable resistor unit configured to connect between a terminal to which the reference voltage is applied and the middle terminal and to increase a resistance value thereof if the second control code is decreased; and
an operational amplifier configured to receive the conversion voltage and a voltage of the middle terminal to output the output voltage.

16. A method of generating a voltage, the method comprising:
setting an initialization value of a code signal while an output range adjusting operation is performed;
generating a conversion voltage in response to the code signal while the output range adjusting operation is performed;
amplifying the conversion voltage to generate an output voltage while the output range adjusting operation is performed,
determining a magnitude of the output voltage to set an amplification gain while the output range adjusting operation is performed; and
outputting the output voltage in response to a set amplification gain after the output range adjusting operation is complete, wherein setting the amplification gain includes:
comparing the output voltage and a voltage generated in response to a power supply voltage to generate a comparison signal; and
determining whether a state of the comparison signal is changed such that the code signal is varied in response to the comparison signal if the state of the comparison signal is not changed, and at the time when the state of the comparison signal is changed the amplification gain is set according to the code signal.

17. A method of generating a voltage, the method comprising:
setting an initialization value of a code signal while an output range adjusting operation is performed;
generating a conversion voltage in response to the code signal while the output range adjusting operation is performed;
amplifying the conversion voltage to generate an output voltage while the output range adjusting operation is performed,
determining a magnitude of the output voltage to set an amplification gain while the output range adjusting operation is performed; and
outputting the output voltage in response to a set amplification gain after the output range adjusting operation is complete, wherein setting the amplification gain includes:
setting an initialization value of a control code according to the initialization value of the code signal;
comparing the output voltage and a voltage generated in response to the power supply voltage to generate a comparison signal; and
determining whether the state of the comparison signal is changed such that the control code is varied in response to the comparison signal if the state of the comparison signal is not changed, and at the time when the state of the comparison signal is changed the amplification gain is set according to the control code, wherein generating the output voltage while the output range adjusting operation is performed includes generating the output voltage according to the amplification gain varied in response to the control code.

* * * * *